United States Patent

Sugimoto et al.

[11] Patent Number: 5,762,709
[45] Date of Patent: Jun. 9, 1998

[54] SUBSTRATE SPIN COATING APPARATUS

[75] Inventors: Kenji Sugimoto; Katsushi Yoshioka; Seiichiro Okuda; Tsuyoshi Mitsuhashi, all of Kyoto, Japan

[73] Assignee: Dainippon Screen Mfg. Co., Ltd., Japan

[21] Appl. No.: 680,983

[22] Filed: Jul. 16, 1996

[30] Foreign Application Priority Data

Jul. 27, 1995 [JP] Japan ................. 7-212635

[51] Int. Cl.⁶ ................................................. B05C 11/02
[52] U.S. Cl. ................. 118/52; 118/56; 118/319; 118/320; 118/500
[58] Field of Search ................. 118/52, 56, 319, 118/320, 500

[56] References Cited

U.S. PATENT DOCUMENTS

| | | | |
|---|---|---|---|
| 5,143,552 | 9/1992 | Moriyama | 118/52 |
| 5,180,431 | 1/1993 | Sugimoto et al. | 118/52 |
| 5,198,034 | 3/1993 | DeBoer et al. | 118/500 |

FOREIGN PATENT DOCUMENTS

| | | | |
|---|---|---|---|
| 3175617 | 7/1991 | Japan. | |
| 6-170316 | 6/1994 | Japan | 118/52 |

Primary Examiner—Donald E. Czaja
Assistant Examiner—Michael P. Colaianni
Attorney, Agent, or Firm—Ostrolenk, Faber, Gerb & Soffen, LLP

[57] ABSTRACT

A substrate spin coating apparatus for forming a coating film on the upper surface of a spinning substrate includes a spin chuck for supporting and spinning the substrate while holding same substantially in horizontal posture. A scatter preventive cup surrounds lateral and lower regions of the spin chuck, and defines an opening in an upper central region thereof for allowing entry of air flows. An exhaust vent is provided for downwardly exhausting the air flows, and a nozzle is provided for supplying a coating solution through the opening of the scatter preventive cup to the upper surface of the substrate. The scatter preventive cup includes an air passage formed in a bottom region thereof and opening toward a lower surface of the substrate. An air flow adjusting unit is connected to the air passage for adjusting an air flow to a predetermined temperature and supplying the adjusted air flow to the air passage.

18 Claims, 5 Drawing Sheets

SUBSTRATE SPIN COATING APPARATUS

BACKGROUND OF THE INVENTION (1) Field of the Invention

This invention relates to apparatus for supplying a coating solution to substrates such as semiconductor wafers, glass substrates for photomasks, glass substrates for liquid crystal displays or substrates for optical disks. More particularly, the invention relates to a substrate spin coating apparatus for forming a coating film on upper surfaces of such substrates while they are spinning.

(2) Description of the Related Art

A conventional substrate spin coating apparatus of the type noted above will be described with reference to FIG. 1.

Figure 1:
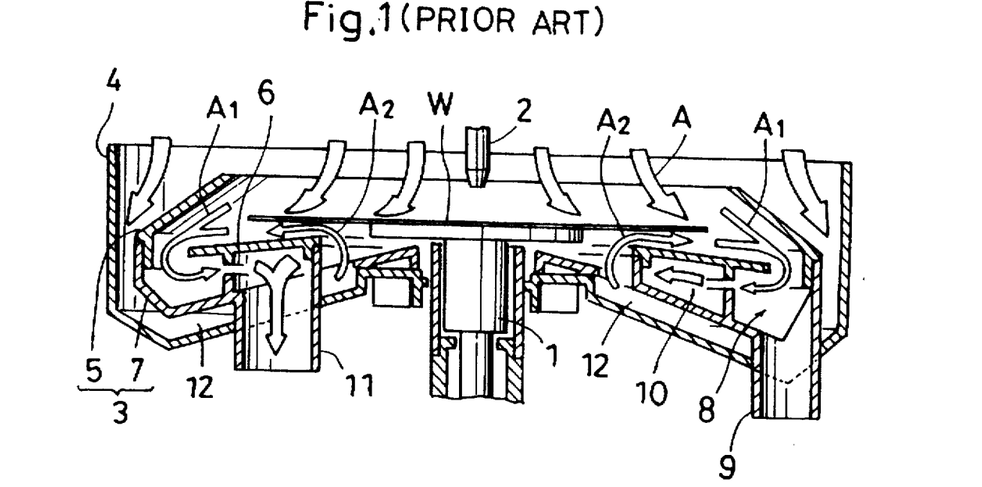
FIG. 1 is a vertical section of a conventional substrate spin coating apparatus.

This apparatus includes a suction type spin chuck 1 for supporting and spinning a substrate W substantially in horizontal posture, a nozzle 2 for supplying a coating solution to the substrate W from above, a scatter preventive cup 3 surrounding lateral and lower regions of the spin chuck 1 for preventing scattering of the coating solution, and an outer cup 4 surrounding the scatter preventive cup 3.

The scatter preventive cup 3 includes an upper cup 5, a circular baffle disk 6 and a lower cup 7. The upper cup 5 defines an upper central opening for allowing entry of air flows A, and a slant surface for downwardly guiding sprays of the coating solution produced by a spin of substrate W. At the periphery of substrate W, air flows A entering through the opening of the upper cup 5, are guided downwardly by baffle disk 6 to form air flows A1. The sprays of the coating solution guided downward by the slant surface of upper cup 5 turn into mist, and these air flows A1 entrain the mist into the lower cup 7. The lower cup 7 defines a drainage zone 8 in a bottom thereof. The coating solution collected in the drainage zone 8 is withdrawn through a liquid outlet 9. A gas exhaust zone 10 is formed inwardly of the drainage zone 8. The gas exhaust zone 10 is exhausted through an exhaust vent 11 by a suction device not shown. The mist of the coating solution and any particles of dust guided into the lower cup 7 are exhausted along with air flows A1.

The outer cup 4 defines a bypass passage 12 with the scatter preventive cup 3 for circulating part of the air flows A. The bypass passage 12 communicates with a space between a lower surface of substrate W supported by the spin chuck 1 and an upper surface of the circular baffle disk 6. The space between the lower surface of substrate W and the upper surface of the baffle disk 6 is decompressed to produce a negative pressure under the influences of a spin of substrate W and by action of the suction device. Consequently, air flows A2 circulating through the bypass passage 12 proceed along the lower surface of substrate W toward peripheral edges thereof to join the downward air flows A1 without disturbing the latter.

With the apparatus having the above construction, when the coating solution is supplied from the nozzle 2 to the upper surface of substrate W in a spin, the mist formed by the scattering coating solution is prevented from flowing round to the lower surface of substrate W to adhere to and contaminate such lower surface.

In the conventional apparatus, due to the heat of vaporization of the coating solution, the air flows A2 along the lower surface of substrate W have their temperature reduced when passing through the space between the scatter preventive cup 3 and outer cup 4. This reduced temperature lowers the temperature of substrate W and ambient (atmospheric) temperature around substrate W. This is because the temperature of the scatter preventive cup 3 is lowered by vaporization of the coating solution scattering from the substrate W and adhering to inner walls of the scatter preventive cup 3. This temperature drop impairs uniformity in the thickness of coating film on the substrate or interferes with obtaining desired stability in the average film thickness on the substrate, which are particularly vulnerable to the influence of temperature.

SUMMARY OF THE INVENTION

This invention has been made having regard to the state of the art noted above, and has for an object to provide a substrate spin coating apparatus which supplies temperature-controlled air flows to lower surfaces of substrates, thereby enhancing uniformity in the thickness of coating film, while maintaining the lower surfaces of the substrates clean.

The above object is fulfilled, according to this invention, by a substrate spin coating apparatus for forming a coating film on an upper surface of a spinning substrate, comprising:

a spin support device for supporting and spinning the substrate substantially in horizontal posture;

a scatter preventive cup surrounding lateral and lower regions of the spin support device, and defining an opening in an upper central region thereof for allowing entry of air flows, an exhaust vent for downwardly exhausting the air flows, and an air passage formed in a bottom region of the scatter preventive cup and opening toward a lower surface of the substrate;

a coating solution supply device for supplying a coating solution through the opening to the upper surface of the substrate; and an adjusted air flow supply device for adjusting air flow to a predetermined temperature and supplying an adjusted air flow to the air passage in the bottom region of the scatter preventing cup.

When the coating solution is supplied to the upper surface of the spinning substrate through the coating solution supply device, a superfluous part of the coating solution scatters around the substrate. The scattering coating solution turns into mist and remains in the scatter preventive cup. The mist and particles in the scatter preventive cup are discharged as entrained by air flows entering through the upper central opening and flowing down around the edges of the substrate toward the exhaust vent. At this time, any negative pressure produced under the substrate by the spin thereof is canceled by the adjusted air flow supplied through the air passage opening toward the lower surface of the substrate. Thus, the air flows entraining the mist and particles will not move around to the lower surface of the substrate. The adjusted air flow is supplied to the air passage after being adjusted to a predetermined temperature by the adjusted air flow supply device. Thus, the adjusted air flow maintains the temperature of the substrate and ambient (atmospheric) temperature to be constant, to influence the thickness of film formed on the substrate.

As noted above, any negative pressure occurring under the substrate is canceled by supplying the air flow adjusted to the predetermined temperature through the air passage opening toward the lower surface of the substrate. This air flow maintains the substrate temperature and ambient temperature at the predetermined temperature while protecting the lower surface of the substrate from adhesion of mist and particles. Consequently, the substrate is maintained clean and the coating film formed thereon has a uniform thickness.

Preferably, the spin support device includes a rotary shaft, and a bearing in slidable contact with a peripheral surface of the rotary shaft for preventing wobbling of the rotary shaft in rotation, the air passage being formed between the scatter preventive cup and the bearing to surround the rotary shaft, and defining a small opening for discharging part of the adjusted air flow toward a position of slidable contact between the rotary shaft and the bearing.

Part of the adjusted air flow is discharged through the small opening of the air passage toward the position of the bearing slidably supporting the rotary shaft. Particles of dust generated in that position may be removed by the adjusted air flow emerging from the small opening. This prevents these particles from being blown through the air passage up to the lower surface of the substrate, thereby maintaining the substrate clean.

Preferably, the air passage includes a damper for varying a passage area thereof.

The air passage with a variable passage area allows the adjusted air flow to be supplied at a suitably selected velocity and in a suitably selected quantity to the lower surface of the substrate. Since velocity and quantity of the adjusted air flow are suitably selected based on speed of rotation and size of the substrate, the negative pressure under the substrate may be canceled effectively.

Preferably, the passage area is fixed based on a substrate size and a maximum speed of rotation which the spin support device imparts to the substrate.

The negative pressure is generated under the substrate by air flows occurring at a boundary between the lower surface of the substrate and air while the substrate is spinning. A maximum negative pressure is determined by the size and maximum rotational speed of the substrate. Thus, the negative pressure under the substrate may be canceled adequately by fixing the passage area based on the substrate size and maximum speed of rotation.

The passage area may be selected based on a substrate size and rotational speed imparted to of the substrate by the spin support device.

Generally, the rotating rate is made variable for spin-coating substrates. The negative pressure under the substrate may be canceled constantly with precision by selecting a passage area based on the speed of rotation.

Preferably, the adjusted air flow supply device is operable also to adjust the air flow to a predetermined humidity and supply the adjusted air flow to the air passage.

The adjusted air flow supply device adjusts the air flow to the predetermined humidity as well as to the predetermined temperature. Thus, the substrate temperature and ambient temperature influencing the thickness of the film being formed are maintained constant, and so is the ambient humidity which also influences film thickness. This feature enhances uniformity in the thickness of coating film.

Preferably, the adjusted air flow supply device is operable to supply the air flow in a predetermined quantity to the air passage.

The negative pressure under the substrate is varies with size and the rotational speed of the spin support device supporting the substrate. Thus, the adjusted air flow may be supplied in a quantity suited to cancel the negative pressure, which quantity is selected with reference to the substrate size and speed of rotation. While maintaining the substrate clean, the negative pressure may be canceled with precision to enhance uniformity in coating film thickness despite variations in substrate size and rotational speed.

In a preferred embodiment of the invention, the adjusted air flow supply device includes an air outlet communicating with the air passage for outputting the adjusted air flow thereto, an air intake for taking in an air flow, and a refrigerator, a heater and a humidifier arranged in order from the air intake to the air outlet.

The refrigerator cools the air flow taken in through the air intake, and the heater disposed downstream thereof adjusts the air flow to the predetermined temperature. Even where there is a small difference between the air flow taken in and the adjusted air flow, the adjusted air flow may be released from the air outlet after a precise temperature adjustment. A precise humidity adjustment may also be made since the refrigerator dehumidifies the air flow and then the humidifier disposed downstream thereof adjusts the air flow to the predetermined humidity.

Preferably, the humidifier comprises a steam jet type humidifier.

This type of humidifier does not release any impurities contained in the water used for humidification, whereby generating particles is avoided. Thus, the adjusted air flow supply device may have only a simple filter or no filter.

Alternatively, the humidifier may comprise a vaporization type humidifier.

The air passage may be formed between the spin support device and an edge of the substrate, as seen in plan view.

By rotating, the spin support device may generate particles of dust. The air passage not surrounding the spin support device has a simple structure, and yet is capable of supplying the clean adjusted air flow to the lower surface of the substrate.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENT

A preferred embodiment of this invention will be described in detail hereinafter with particular reference to FIGS. 2 through 5 of the drawings.

Figure 2:
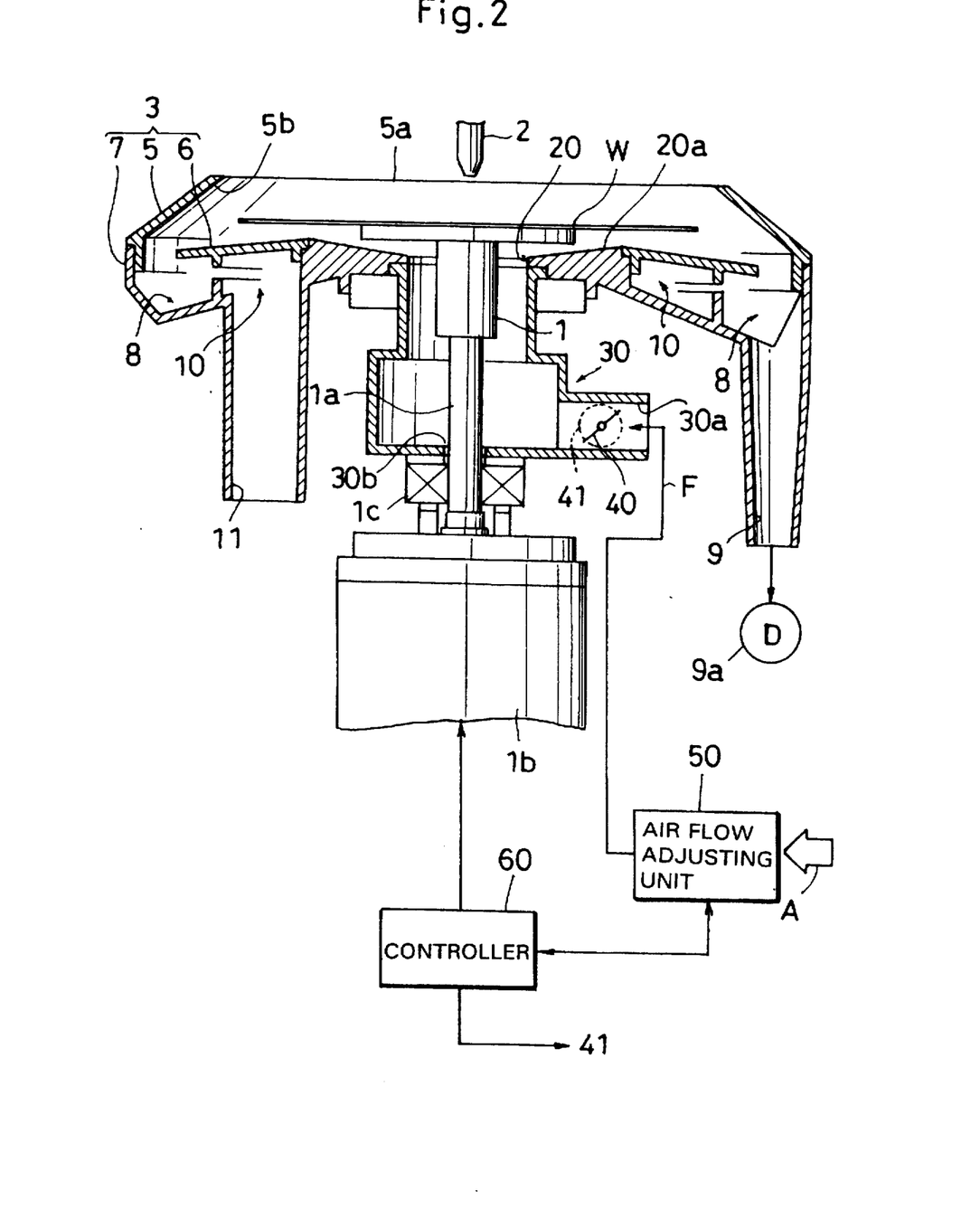
FIG. 2 is a vertical section of a substrate spin coating apparatus according to this invention.

In FIG. 2, numeral 1 denotes a suction type spin chuck for suction-supporting a substrate W substantially in horizontal posture. The spin chuck 1 is rotatable by drive transmitted through a hollow rotary shaft 1a from an electric motor 1b. The rotary shaft 1a is rotatably supported adjacent a lower end thereof by a bearing 1c to suppress wobbles during rotation. A nozzle 2 is disposed above the spin chuck 1 for supplying a coating solution (which is a photoresist solution in this embodiment) to an upper surface of substrate W. The suction type spin chuck 1 corresponds to the spin support device of this invention. The nozzle 2 corresponds to the coating solution supply device of this invention.

The spin chuck 1 is surrounded in lateral and lower regions thereof by a scatter preventive cup 3 for preventing scattering of the photoresist solution. The scatter preventive cup 3 includes an upper cup 5, a circular baffle disk 6 and a lower cup 7. The upper cup 5 defines an opening 5a in an upper central region thereof, and a slanted lateral surface 5b on an inner side wall thereof for downwardly guiding sprays of the photoresist solution produced by a spin of substrate W.

The circular baffle disk 6 has a slant surface for uniforming and guiding air flows entering through the opening 5a and descending round peripheral edges of substrate W into the lower cup 7. The sprays of the photoresist solution guided downward by the slant surface 5b of upper cup 5 are entrained by these air flows to enter the lower cup 7.

The lower cup 7 includes an annular drainage zone 8 disposed below the slant surface 5b of upper cup 5. A liquid outlet 9 is formed in a portion of drainage zone 8. The liquid outlet 9 is connected to a drainage tank 9a for collecting the sprays of the photoresist solution produced during a coating process. Inwardly of the drainage zone 8 is an annular gas exhaust zone 10 defined by the circular baffle disk 6 fitted on a bottom portion of lower cup 7. The gas exhaust zone 10 has an exhaust vent 11 formed in a bottom thereof and communicating with a suction device not shown. Thus, mist of the photoresist solution and any particles of dust floating in the scatter preventive cup 3 are drawn and exhausted along with the air flows entering through the opening 5a of upper cup 5.

The lower cup 7 has an opening 20 formed in a bottom portion thereof adjacent a spin axis of substrate W. This opening 20 has an inside diameter larger than an outside diameter of a portion of the spin chuck 1 connected to the rotary shaft 1a. The opening 20 is opposed to the lower surface of substrate W supported thereabove. An air flow guide surface 20a extends upward from the opening 20 toward the peripheral edges of substrate W.

An air supply conduit 30 surrounding the rotary shaft 1a extends upward to the opening 20 of lower cup 7. The air supply conduit 30 receives adjusted air flow F at all inlet 30a thereof. The adjusted air flow F exit the conduit 30 through the opening 20. The air supply conduit 30 includes a small opening 30b formed directly over a position of slidable contact between the rotary shaft 1a and bearing 1c. This opening 30b has a far smaller opening area than the opening 20. A small part of air flow F exits through the small opening 30b. The inlet 30a includes a damper 40 for varying a passage area thereof. The damper 40 is rotatable by a damper drive motor 41. The damper 40 has a function to adjust the velocity and quantity of air flow F by varying the passage area. It is therefore preferable that the damper 40 is disposed as close to the opening 20 as possible.

The air flow F supplied to the air supply conduit 30 is produced by an air flow adjusting unit 50 which takes in air flow A from inside a cleanroom and provides predetermined processes therefor. The air flow adjusting unit 50 is controlled by a controller 60 which also controls rotation of the electric motor 1b and delivery of the photoresist solution through the nozzle 2. The controller 60 includes a memory, and controls the above components based on a processing sequence (also called a recipe) stored in the memory.

Figure 3:
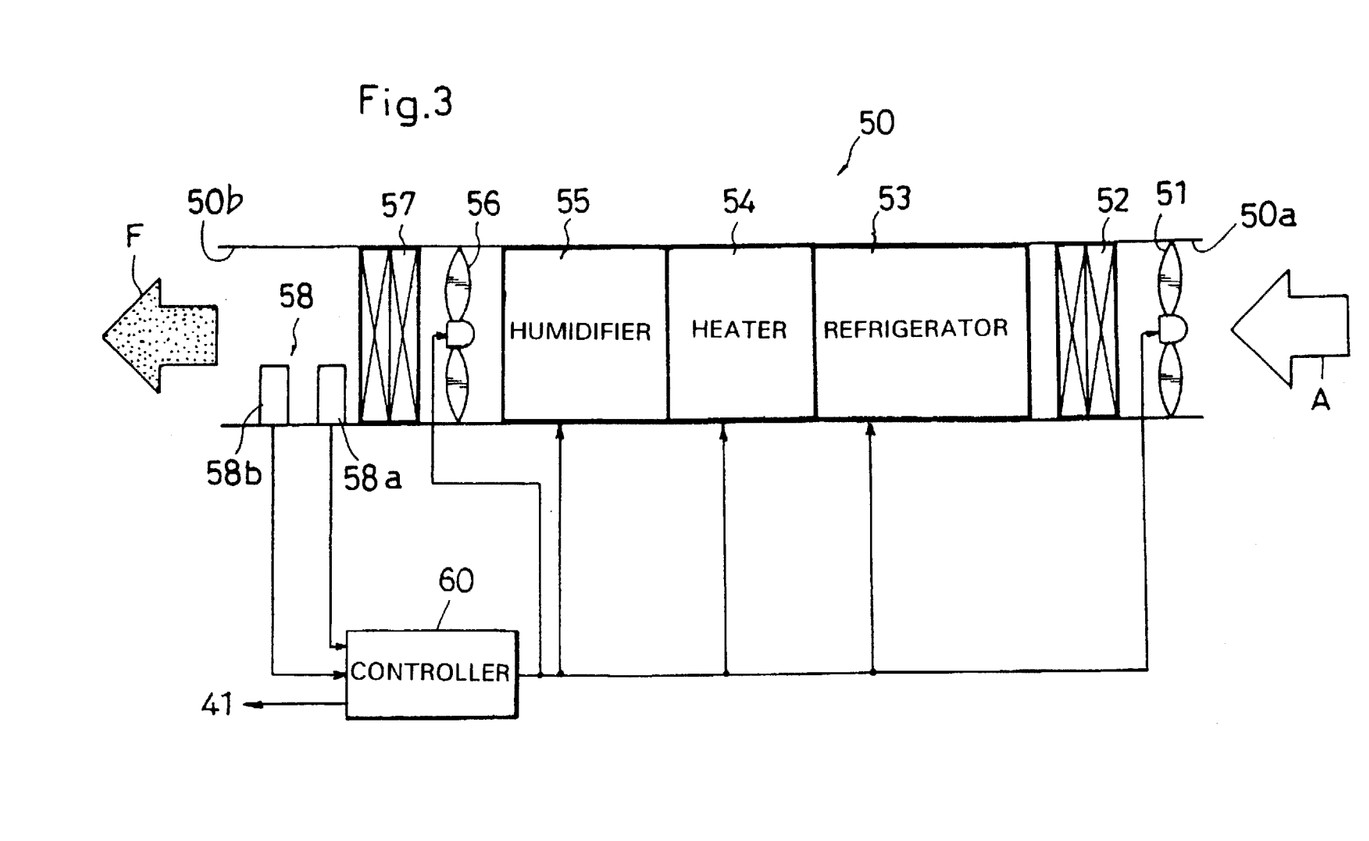
FIG. 3 is a block diagram of an air flow adjusting unit.

With reference to FIG. 3, it is seen that the air flow adjusting unit 50 takes in air flow A from inside a cleanroom (not shown) through an air intake 50a, effects varied adjustments of air flow A, and discharges adjusted air flow F through an air outlet 50b. The air outlet 50b is connected to the inlet 30a of the air supply conduit 30 through a duct not shown.

The air flow adjusting unit 50 includes, arranged successively from air intake 50a to air outlet 50b, a first fan 51, a first filter 52, a refrigerator 53, a heater 54, a humidifier 55, a second fan 56, a second filter 57 and a detector 58. The detector 58 includes a humidity sensor 58a and a temperature sensor 58b.

The first fan 51 takes in air flow A, and feeds it to the refrigerator 53 through the first filter 52 which substantially removes particles from the air flow A. The refrigerator 53 cools the air flow A to a predetermined temperature. The refrigeration is done to dehumidify the air flow A, and also to cool the air flow A before same is heated to a predetermined temperature by the heater 54 disposed at a subsequent stage. The air flow A is cooled by refrigerator 53 since the precision of temperature adjustment by the heater 54 would be low if there were only a slight temperature difference between air flow A and adjusted air flow F. The cooling step enhances the precision of temperature adjustment.

After the heater 54 adjusts the air flow A to the predetermined temperature, the humidifier 55 adjusts the air flow A to a predetermined humidity. This humidity adjustment is carried out with high precision since the air flow A is dehumidified while being cooled at the refrigerator 53. This humidifier 55 is, for example, a water spray type ultrasonic humidifier for spraying a mist of deionized water (not shown) formed by ultrasonic vibration. Instead of being of a water spray type, the humidifier 55 may be of a steam jet type or vaporization type. Where the steam jet type or vaporization type is employed, the downstream filter may be omitted or simplified since such humidifying mode has the advantage of not releasing impurities that may be contained in water.

The air flow A taken in through the air intake 50a is retarded in movement from the first filter 52 to the humidifier 55. The second fan 56 compensates for the retardation. Subsequently, the second filter 57 removes particles and the like that may be generated in the upstream components 53, 54 and 55. The second filter 57, which is the final filter, preferably is a high-performance filter having a specially processed glass material set in pleats, for example. Preferably, a final filter in an air-conditioning system of the cleanroom is used as this high-performance filter.

The humidity sensor 58a and temperature sensor 58b are arranged downstream of the second, final filter 57, for detecting actual temperature and actual humidity of the air flow F after the temperature and humidity adjustments. Both humidity sensor 58a and temperature sensor 58b are connected to the controller 60. Based on differences between detected humidity and temperature and predetermined target humidity and temperature, the controller 60 controls operations of refrigerator 53, heater 54 and humidifier 55. The controller 60 also controls the first fan 51 and second fan 56 to operate at a fixed rotating rate to feed adjusted air flow F at a fixed velocity and in a fixed quantity. In practice, the velocity and quantity of adjusted air flow F are variably by adjusting the opening degree of the damper 40 described hereinbefore.

The air flow F adjusted to the predetermined temperature and humidity is released at the fixed velocity and in the fixed quantity from the air outlet 50b, and supplied to the inlet 30a of the air supply conduit 30 through the duct not shown (FIG. 2). Depending on the shape of the duct leading to inlet 30a, the velocity and quantity of adjusted air flow F therethrough may deviate to a great extent from set values. In this embodiment, therefore, the controller 60 operates the damper drive motor 41 to control the opening degree of the damper 40 disposed in the inlet 30a. The adjusted air flow F supplied to the air supply conduit 30 is delivered through the opening 20 toward the lower surface of substrate W.

The opening 20 of lower cup 7 and the air supply conduit 30 correspond to the air passage of this invention. The air flow adjusting unit 50 corresponds to the adjusted air flow supply device of this invention.

Figure 4A:
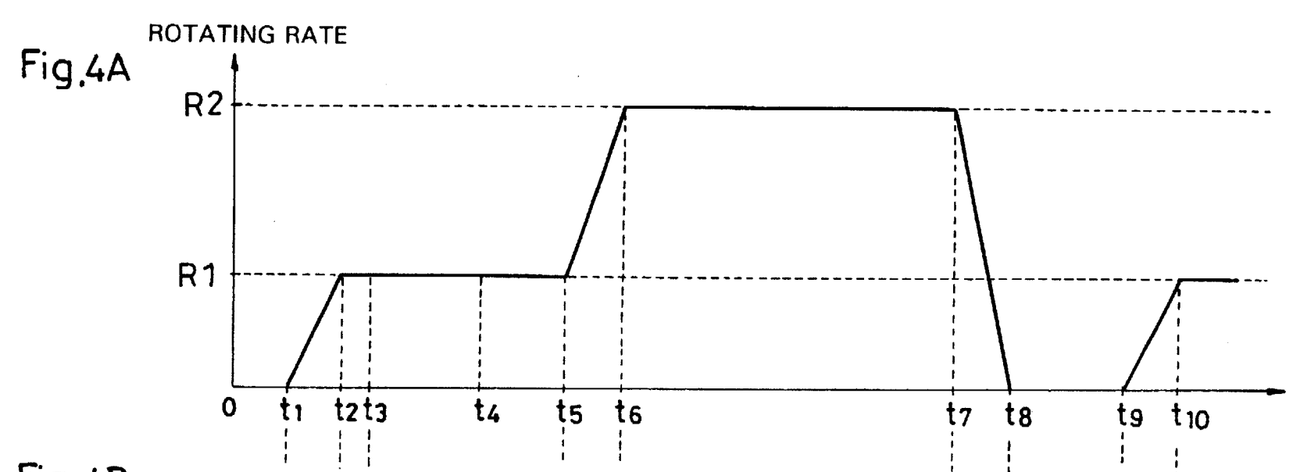
FIGS. 4A and 4B are time charts showing a photoresist coating process and supply of adjusted air flows.
Figure 4B:
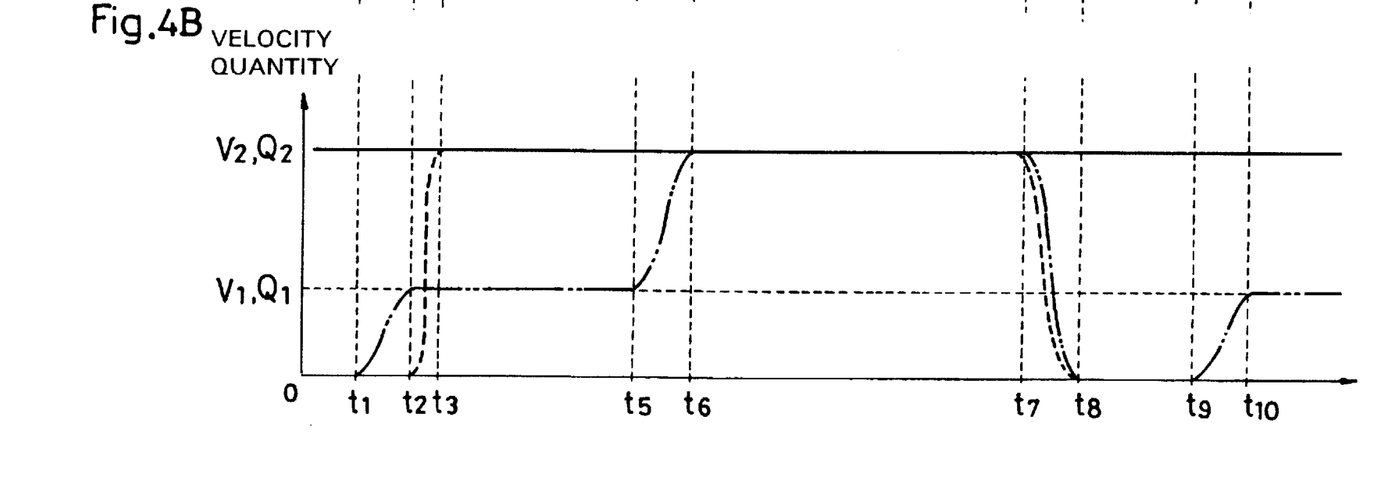
Figure 5:
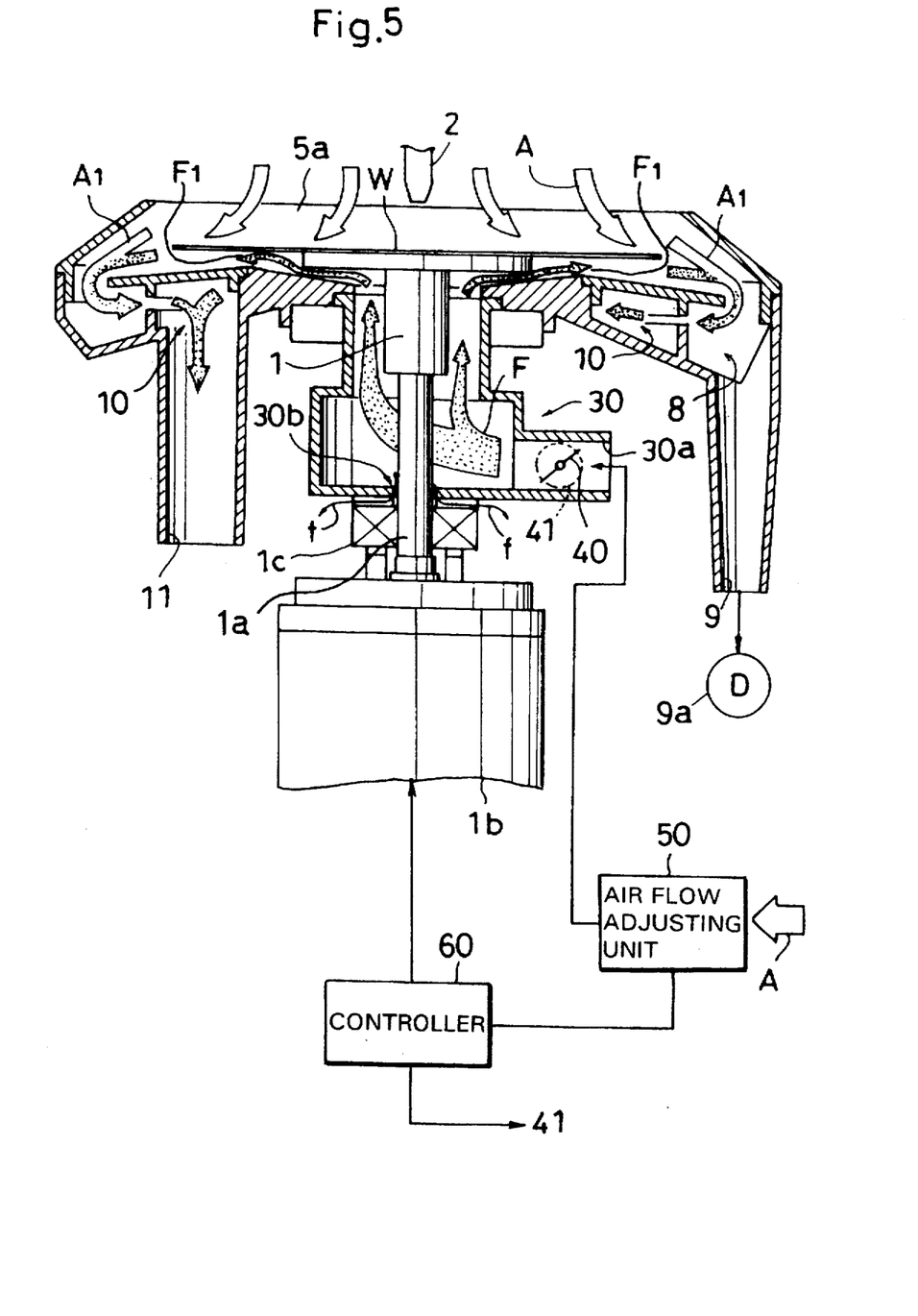
FIG. 5 is a schematic constituting an explanatory view of operation.

An operation of the substrate spin coating apparatus having the above construction will be described next with reference to FIGS. 4A, 4B and 5. FIG. 4A is a time chart showing the operation of the substrate spin coating apparatus. FIG. 4B is a time chart showing the velocity and quantity of the adjusted air flow. FIG. 5 is a schematic view showing air flows occurring during a coating process.

In this embodiment, as shown in a solid line in FIG. 4B, the controller 60 controls the air flow adjusting unit 50 and damper 40 to deliver the adjusted air flow F at fixed velocity V2 and in fixed quantity Q2 through the opening 20. Also, while substrate W is transported into and out of the apparatus controller 60 acts so that the adjusted air flow F is at relatively lower velocity V1 and at relatively lower quantity Q1. The velocity V2 and quantity Q2 are determined in advance based on the size of substrate W and a maximum rotating rate thereof.

Referring to FIG. 4A, a lift device (not shown) moves the spin chuck 1 and scatter preventive cup 3 vertically relative to each other, and a transport arm (not shown) transports substrate W into the apparatus to be suction-supported by the spin chuck 1. After the transport arm (not shown) transports substrate W into the apparatus the lift device (not shown) moves in reverse to operate spin chuck 1 and scatter preventive cup 3 vertically relative to each other, so that the scatter preventive cup 3 surrounds lateral and lower regions of the spin chuck 1. Next, the controller 60 controls the electric motor 1b to start rotating at time t1 and reach a low rotating rate R1 at time t2. The photoresist solution begins to be delivered at a predetermined flow rate from the nozzle 2 to a position of substrate W adjacent the spin axis thereof at a point of time t3 which is a predetermined time after time t2. At this time t3 the spin of substrate W has stabilized at the rotating rate R1. The photoresist solution is stopped at a point of time t4 which is a predetermined time after point of time t3.

At a point of time t5, which is after the photoresist solution covers the entire upper surface of substrate W, the controller 60 increases the rotating rate or rotational speed of electric motor 1b from the low rotating rate R1. The electric motor 1b reaches a high rotating rate R2 at a point of time t6. The high rotating rate R2 is maintained till time t7, during which a superfluous part of the photoresist solution covering the entire surface of substrate W is scattered to the ambient. The scattering photoresist solution is guided downward along the slant surface 5b of the upper cup 5, and collected in the drainage tank 9a through the drainage zone 8 and liquid outlet 9. As shown in FIG. 5, mist of the scattering photoresist solution and particles of dust are entrained by the air flows A1 entering through the opening 5a and flowing downward round the edges of substrate W, to be exhausted through the gas exhaust zone 10 and exhaust vent 11.

The spin of substrate W generates a negative pressure thereunder, which is canceled by the adjusted air flow F supplied toward the lower surface of substrate W through the opening 20 to form adjusted air flows F1. The adjusted air flows F1 move along the lower surface of substrate W toward the edges thereof, and join the air flows A1 moving into the gas exhaust zone 10, to be exhausted through the exhaust vent 11. Thus, the mist and particles are smoothly exhausted as entrained by the air flows A, without flowing round to the lower surface of substrate W, whereby the lower surface of substrate W is maintained clean.

Subsequently, the controller 60 controls the electric motor 1b to slow down at time t7 and to stop the spin of substrate W completely at time t8. Then, the transport arm is operated to transport the treated substrate W out of the apparatus, and to transport a new substrate W into the apparatus. The above process is repeated at time t9 et seq. In this way, a plurality of substrates W are treated successively.

In forming a photoresist film on the upper surface of substrate W by supplying the photoresist solution thereto temperature of substrate W and ambient, i.e. atmospheric, temperature and humidity are extremely important when the photoresist solution is being applied to substrate W. This is because the solvent included in the photoresist solution volatilizes to varied extents, depending on such temperature and humidity. Varying degrees of volatilization result in varied film thicknesses on the surface of substrate W. This causes a fatal defect to be produced in a subsequent process (i.e. a photolithographic process in this case). It is therefore extremely important to form a photoresist film with a high degree of uniformity in thickness.

Thus, the air flow F is adjusted to the predetermined temperature and humidity for delivery toward the lower surface of substrate W. This adjusted air flow F is effective to maintain the temperature of the lower surface of substrate W (which, naturally, influences the upper surface thereof) as well as the temperature and humidity of the atmosphere at the predetermined temperature and humidity. This assures uniformity in the thickness of the photoresist film formed on the upper surface of substrate W. As noted hereinbefore, the air flow adjusting unit 50 takes in air flow A from a cleanroom, and adjusts the temperature, humidity, quantity and velocity thereof. The first fan 51 and second fan 56 are not required where the air flow A taken in is of sufficient quantity and is at velocity. Where the humidity of air flow A has excellent stability, there is no need to adjust the humidity and therefore the humidifier 55 becomes dispensable.

As described above, the adjusted air flow F supplied to cancel the negative pressure generated under the substrate W maintains the lower surface thereof clean, and maintains the temperature of substrate W and ambient temperature at the predetermined temperature and ambient humidity at the predetermined humidity, thereby to enhance uniformity in the thickness of photoresist film that is formed on substrate W. This also stabilizes the ambient temperature and humidity, to suppress variations in film thickness among the substrates treated successively.

In the above embodiment, the adjusted air flow F is supplied constantly (as shown in the solid line in FIG. 4B). However, as shown in a dotted line in FIG. 4B, the adjusted air flow F may be supplied at velocity V2 and in quantity Q2 only from point of time t3 at which the photoresist solution begins to be supplied until point of time t7 at which the high rotating rate R2 is discontinued.

Further, the negative pressure generated under substrate W is variable with substrate size and rotating rate. When, for example, substrate W is 8-inch size and rotating rate is 3,000 rpm/min., a flow rate is approximately 750 lit/min. It is preferable to adjust the rate of adjusted air flow F under the lower surface of substrate W correspondingly. That is, the velocity and quantity of adjusted air flow F should preferably be adjusted according to the rotating rate of substrate W, as shown in a two-dot-and-dash line in FIG. 4B. Specifically, while substrate W is spinning at low rotating rate R1 from time t2 to time t5, the adjusted air flow F may be supplied at velocity V1 and in quantity Q1 (to suit the size and low rotating rate R of substrate W) which are less than velocity V2 and quantity Q2. While substrate W is spinning at high rotating rate R2 from time t6 to time t7, the adjusted air flow F may be supplied at velocity V2 and in quantity Q2. In this way, the negative pressure under substrate W may be eliminated with exactitude precision. Since the flow velocity and quantity are variable with the size and rotating rate of substrate W, the controller 60 should preferably adjust the rotating rate of the first and second fans 51 and 56 and the opening degree of the damper 40. Then, the adjusted air flow F is supplied at a rate suited to cancel the negative pressure according to the size and rotating rate of substrate W.

As shown in FIG. 5, air flows f forming part of adjusted air flow F is blown out toward the bearing 1c through the small opening 30b formed in a bottom portion of the air supply conduit 30. Thus, particles of dust produced by the sliding contact between the rotary shaft 1a and bearing 1c are discharged without being blown upward to the lower surface of substrate W. This further assures cleanness of substrate W.

Figure 6:
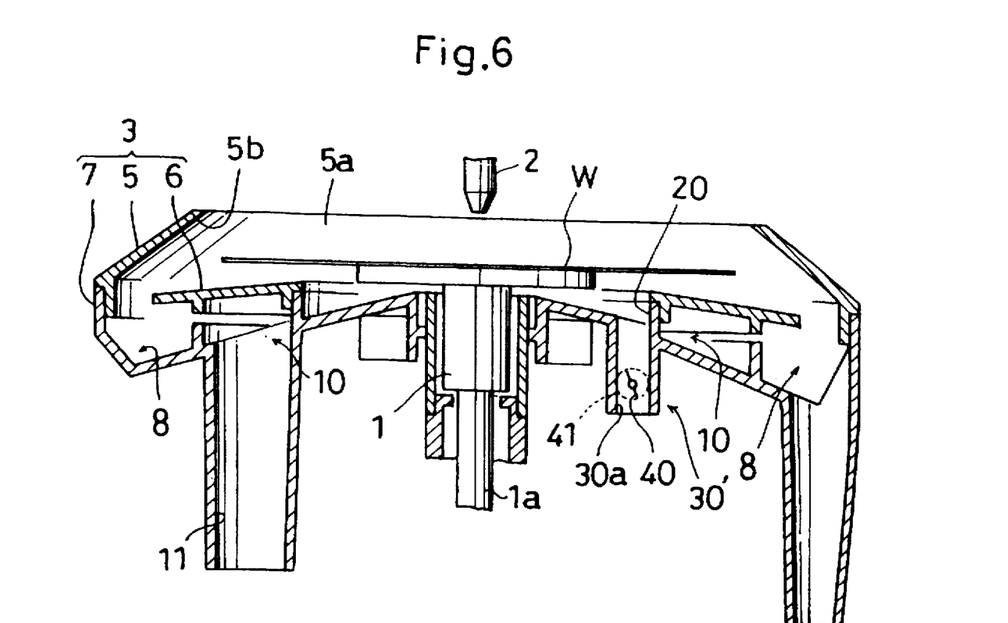
FIG. 6 is a vertical section of a modified substrate spin coating apparatus.

In the foregoing embodiment, the air passage opens from around the rotary shaft 1a toward the lower surface of substrate W. This invention may be modified as shown in FIG. 6, which illustrate an air passage 30' formed between the rotary shaft 1a and gas exhaust zone 10 (as seen in plan view) and extending to the opening 20 opposed to the lower surface of substrate W. Providing air passage 30' that does not surrounded the rotary shaft 1a results in a simplified construction where there is no need to take steps against the particles produced by the rotary shaft 1a. A slant guide plate may be disposed on an inner periphery of the opening 20 to form an opening having a predetermined angle from the spin axis toward the edges of substrate W.

While the foregoing embodiment has been described exemplifying a photoresist solution as a coating solution. This invention is not limited thereto, but is applicable also to a substrate spin coating apparatus for coating substrates with polyimide resin or SOG solution acting as an insulating film or surface protection film.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin coating apparatus for forming a coating film on an upper surface of a spinning substrate, comprising:
   a spin support for supporting and spinning said substrate substantially in horizontal posture;
   a scatter preventive cup surrounding lateral and lower regions of said spin support, and defining an opening in an upper central region of said scatter preventive cup for allowing entry of air flows, an exhaust vent for downwardly exhausting said air flows, and an air passage formed in a bottom region of said scatter preventive cup and being open toward a lower surface of said substrate;
   a coating solution supply device for supplying a coating solution through said opening to said upper surface of said substrate;
   an adjusted air flow supply mechanism for adjusting an air flow to a predetermined temperature and supplying an adjusted air flow to said air passage;
   said adjusted air flow supply mechanism being operable to supply said adjusted air flow in a predetermined quantity to said air passage;
   said predetermined quantity remaining constant throughout treatment of said substrate and being established based on substrate size and maximum rotating rate of said substrate provided by said spin support.

2. An apparatus as defined in claim 1, wherein said spin support includes a rotary shaft, and a bearing in slidable contact with a peripheral surface of said rotary shaft for preventing wobbling of said rotary shaft in rotation, said air passage being formed between said scatter preventive cup and said bearing to surround said rotary shaft, and defining a small opening for discharging part of said adjusted air flow toward a position of slidable contact between said rotary shaft and said bearing.

3. An apparatus as defined in claim 1, also comprising a damper for varying a passage area of said air passage.

4. An apparatus as defined in claim 1, wherein said adjusted air flow supply mechanism is operable also to adjust said air flow to a predetermined humidity level and supply said adjusted air flow to said air passage.

5. An apparatus as defined in claim 4, wherein said adjusted air flow supply mechanism includes an air outlet communicating with said air passage for outputting said adjusted air flow thereto, an air intake for taking in an air flow, and a refrigerator, a heater and a humidifier arranged in order from said air intake to said air outlet.

6. An apparatus as defined in claim 5, wherein said humidifier comprises a steam jet type humidifier.

7. An apparatus as defined in claim 5, wherein said humidifier comprises a vaporization type humidifier.

8. An apparatus as defined in claim 1, wherein when seen in plan view, said air passage is formed between said spin support and an edge of said substrate.

9. An apparatus as defined in claim 8, also comprises a damper for varying a passage area of said air passage.

10. A substrate spin coating apparatus for forming a coating film on an upper surface of a spinning substrate, comprising:
    a spin support for supporting and spinning said substrate substantially in horizontal posture;
    a scatter preventive cup surrounding lateral and lower regions of said spin support, and defining an opening in an upper central region of said scatter preventive cup for allowing entry of air flows, an exhaust vent for downwardly exhausting said air flows, and an air passage formed in a bottom region of said scatter preventive cup and being open toward a lower surface of said substrate;
    a coating solution supply device for supplying a coating solution through said opening to said upper surface of said substrate;
    an adjusted air flow supply mechanism for adjusting an air flow to a predetermined temperature and supplying an adjusted air flow to said air passage;
    said adjusted air flow supply mechanism being operable to supply said adjusted air flow in a predetermined quantity to said air passage;
    said predetermined quantity being variable as a function of substrate size and rotating rate of said substrate provided by said spin support, with said rotating rate varying during treatment of said substrate.

11. An apparatus as defined in claim 10, wherein said spin support includes a rotary shaft, and a bearing in slidable contact with a peripheral surface of said rotary shaft for preventing wobbling of said rotary shaft in rotation, said air passage being formed between said scatter preventive cup and said bearing to surround said rotary shaft, and defining a small opening for discharging part of said adjusted air flow toward a position of slidable contact between said rotary shaft and said bearing.

12. An apparatus as defined in claim 10 also comprising a damper for varying a passage area of said air passage.

13. An apparatus as defined in claim 10, wherein said adjusted air flow supply mechanism is operable also to adjust said air flow to a predetermined humidity level and supply said adjusted air flow to said air passage.

14. An apparatus as defined in claim 13, wherein said adjusted air flow supply mechanism includes an air outlet communicating with said air passage for outputting said adjusted air flow thereto, an air intake for taking in an air flow, and a refrigerator, a heater and a humidifier arranged in order from said air intake to said air outlet.

15. An apparatus as defined in claim 14, wherein said humidifier comprises a steam jet type humidifier.

16. An apparatus as defined in claim 14, wherein said humidifier comprises a vaporization type humidifier.

17. An apparatus as defined in claim 10, wherein when seen in plan view, said air passage is formed between said spin support and an edge of said substrate.

18. An apparatus as defined in claim 17, also comprises a damper for varying a passage area of said air passage.

* * * * *